US012590383B2

(12) United States Patent
Ryu et al.

(10) Patent No.: US 12,590,383 B2
(45) Date of Patent: Mar. 31, 2026

(54) SYNTHETIC CRUCIBLES WITH RIM COATING

(71) Applicant: GlobalWafers Co., Ltd., Hsinchu (TW)

(72) Inventors: JaeWoo Ryu, Chesterfield, MO (US); Carissima Marie Hudson, Saint Charles, MO (US); TaeWon Yuk, Cheonan-si (KR); JunHwan Ji, Cheonan-si (KR)

(73) Assignee: GlobalWafers Co., Ltd., Hsinchu (TW)

( * ) Notice: Subject to any disclaimer, the term of this patent is extended or adjusted under 35 U.S.C. 154(b) by 32 days.

(21) Appl. No.: 17/897,677

(22) Filed: Aug. 29, 2022

(65) Prior Publication Data

US 2024/0068121 A1 Feb. 29, 2024

(51) Int. Cl.
| | |
|---|---|
| *C30B 35/00* | (2006.01) |
| *C30B 15/10* | (2006.01) |
| *C30B 15/22* | (2006.01) |
| *C30B 29/06* | (2006.01) |

(52) U.S. Cl.
CPC .............. *C30B 15/10* (2013.01); *C30B 15/22* (2013.01); *C30B 29/06* (2013.01); *C30B 35/002* (2013.01)

(58) Field of Classification Search
CPC ....... C30B 35/00; C30B 35/002; C30B 15/00; C30B 15/10; C30B 15/20; C30B 15/22; C30B 29/00; C30B 29/02; C30B 29/06
USPC ..... 117/11, 13, 30, 200, 206, 208, 213, 928, 117/931–932
See application file for complete search history.

(56) References Cited

U.S. PATENT DOCUMENTS

| | | | | |
|---|---|---|---|---|
| 5,976,247 | A | * | 11/1999 | Hansen ................. C30B 35/002 |
| | | | | 117/200 |
| 6,548,131 | B1 | * | 4/2003 | Fabian .................. C03B 19/095 |
| | | | | 428/318.6 |
| 7,497,907 | B2 | | 3/2009 | Holder et al. |
| 7,955,715 | B2 | | 6/2011 | Trommer et al. |
| 9,139,932 | B2 | | 9/2015 | Hansen et al. |
| 9,150,447 | B2 | | 10/2015 | Shimazu et al. |
| 9,458,551 | B2 | | 10/2016 | Phillips et al. |
| 2007/0084397 | A1 | | 4/2007 | Hansen et al. |
| 2009/0173276 | A1 | | 7/2009 | Satou |
| 2010/0154702 | A1 | | 6/2010 | Tsujimoto et al. |
| 2014/0150714 | A1 | | 6/2014 | Horioka et al. |

FOREIGN PATENT DOCUMENTS

| | | | | |
|---|---|---|---|---|
| CN | 110552057 | A | 12/2019 | |
| CN | 110629281 | A * | 12/2019 | ............. C04B 35/14 |
| CN | 210420251 | U | 4/2020 | |
| EP | 0748885 | A1 | 12/1996 | |
| JP | 2005255488 | A * | 9/2005 | |

(Continued)

OTHER PUBLICATIONS

Abe et al., "Fused quartz dissolution rate in silicon melts: influence of boron addition", Journal of Crystal Growth 186 (1998), pp. 557-564.

*Primary Examiner* — Kenneth A Bratland, Jr.

(74) *Attorney, Agent, or Firm* — Armstrong Teasdale LLP

(57) ABSTRACT

Synesthetic quartz crucibles for holding a silicon melt during growth of single crystal silicon ingots are disclosed. The crucibles may include a coating disposed on the inner and outer surface of the crucible body along the rim. The coating extends only partially down the sidewall of the crucible and may extend to or beyond the melt line of the crucible.

18 Claims, 9 Drawing Sheets

(56) References Cited

FOREIGN PATENT DOCUMENTS

| JP | 2007277026 A | 10/2007 |
| WO | 2018055974 A1 | 3/2018 |
| WO | WO2022131047 A1 | 6/2022 |

* cited by examiner

SYNTHETIC CRUCIBLES WITH RIM COATING

FIELD OF THE DISCLOSURE

The field of the disclosure relates to crucibles for growing single crystal silicon ingots by the Czochralski method and, in particular, synthetic crucibles that include a rim coating.

BACKGROUND

Quartz crucibles are conventionally used to hold a silicon melt during Czochralski single crystal silicon growth processes. During ingot growth, the crucible softens and, in some instances, deforms. Such crucible deformation can cause the crucible to contact components of the hot zone including the heat shield, potentially causing loss of a zero dislocation ingot.

Synthetic quartz may be used as a liner in crucibles to reduce impurities introduced into the melt during ingot growth. Synthetic quartz crucibles may be characterized by increased melt vibration which causes additional neck pop-outs and increases re-trials.

A need exists for synthetic quartz crucibles which resist deformation and improve crucible smoothness and improve zero dislocation success.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a crucible for holding a silicon melt. The crucible includes a body having a floor and a sidewall extending up from the floor. The floor and sidewall define a cavity for holding the silicon melt. The sidewall has a top, an inner surface and an outer surface. The sidewall has a height that extends from the floor to the top of the sidewall. The body includes synthetic quartz. A coating is disposed on a first inner surface area of the inner surface of the sidewall. The coating includes magnesium, calcium, strontium or barium. The first inner surface area extends only from the top of the sidewall to a distance $D_1$ from the top of the sidewall. The distance $D_1$ is less than the height of the sidewall.

Another aspect of the present disclosure is directed to a method for producing a crucible. A body having a floor and a sidewall extending up from the floor is provided. The floor and sidewall define a cavity for holding a silicon melt. The sidewall has a top, an inner surface and an outer surface. The sidewall has a height that extends from the floor to the top of the sidewall. The body includes synthetic quartz. A coating is applied on a first inner surface area of the inner surface of the sidewall. The coating includes magnesium, calcium, strontium or barium. The first inner surface area extends only from the top of the sidewall to a distance $D_1$ from the top of the sidewall. The distance $D_1$ is less than the height of the sidewall.

Yet another aspect of the present disclosure is directed to a method for forming a single crystal silicon ingot. An initial charge of polycrystalline silicon is added to a crucible. The crucible includes a body having a floor and a sidewall extending up from the floor. The floor and sidewall define a cavity for holding a silicon melt, The sidewall has a top, an inner surface and an outer surface. The sidewall has a height that extends from the floor to the top of the sidewall. The body includes synthetic quartz. A coating is disposed on a first inner surface area of the inner surface of the sidewall. The coating includes magnesium, calcium, strontium or barium. The first inner surface area extends only from the top of the sidewall to a distance $D_1$ from the top of the sidewall. The distance $D_1$ is less than the height of the sidewall. The initial charge of polycrystalline silicon is heated to cause a silicon melt to form in the crucible. A silicon seed crystal is contacted with the silicon melt. The silicon seed crystal is withdrawn to grow a single crystal silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
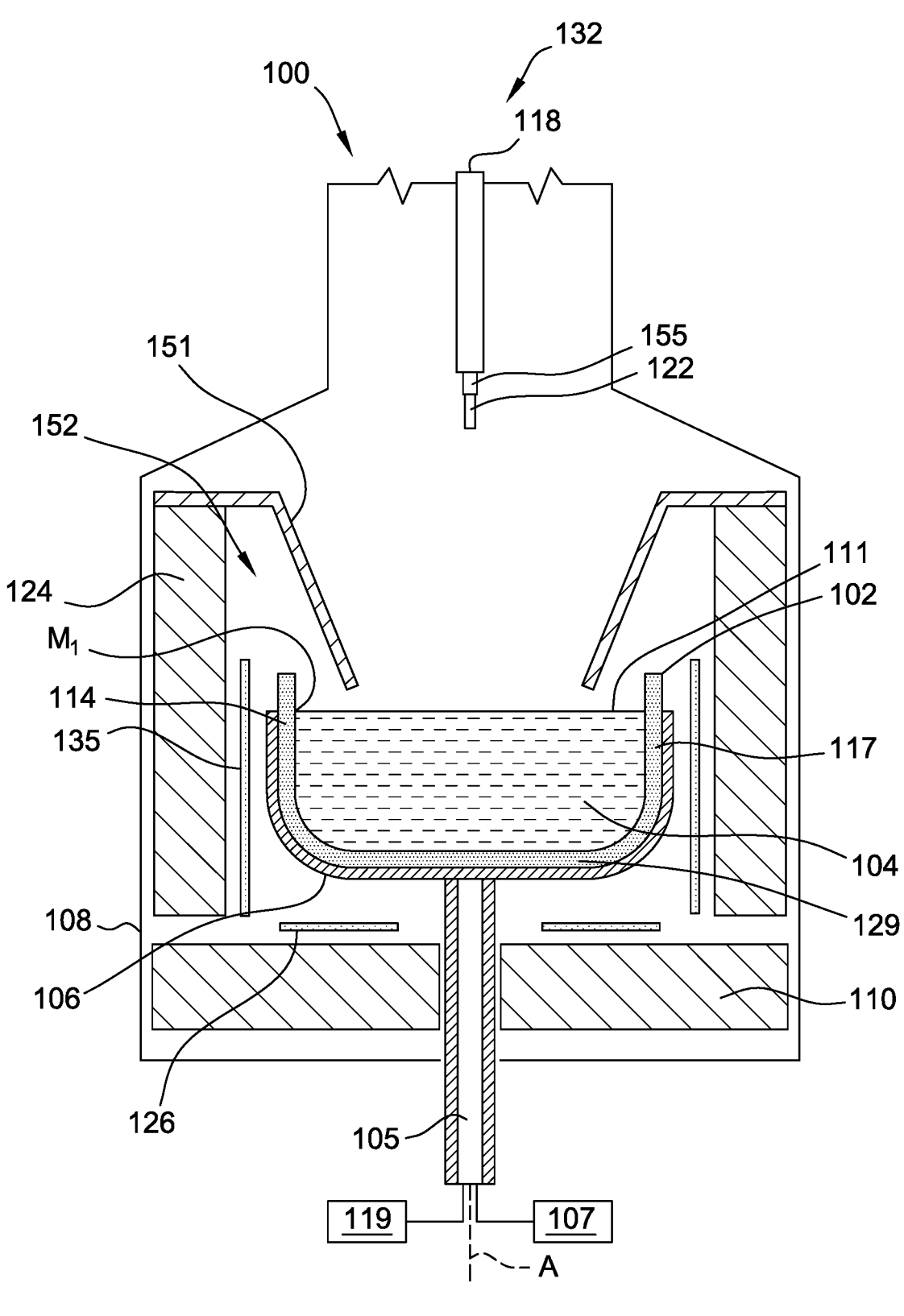
FIG. 1 is a cross-section of an ingot puller apparatus before silicon ingot growth.

With reference to FIG. 1, provisions of the present disclosure relate to coated crucibles 102 (e.g., rim-coated crucibles) for holding a silicon melt in an ingot puller apparatus 100. The ingot puller apparatus 100 and crucible 102 thereof are suitable for growing single crystal silicon ingots 113 (FIG. 2) by the Czochralski method.

The crucible 102 includes a crucible body 103 (FIG. 3) upon which one or more coatings is applied as further described below. The crucible body 103 has a floor 101 and a sidewall 114 that extends from the floor 101. The floor 101 and sidewall 114 define a cavity 144 for holding the silicon melt.

The sidewall 114 is generally vertical and is cylindrical in shape. The sidewall 114 of the crucible body 103 has an inner surface 112 and an outer surface 120. The sidewall 114 has a top 115 and a height $H_{114}$ that extends from the floor 101 to the top 115. The floor 101 of the crucible body includes the curved portion 147 of the crucible body 103 that extends below the sidewall 114. The portion of the crucible body 103 adjacent the top 115 of the sidewall 114 may be referred to herein as the "rim" of the crucible.

The crucible body 103 may be constructed of any material suitable for the holding a silicon melt. For example, the crucible body 103 may be made from quartz. In some embodiments, the crucible body may contain synthetic quartz. For example, the crucible body 103 may include a synthetic quartz liner such that the inner surface 112 of the crucible body 103 that contacts the melt is synthetic quartz. Synthetic quartz may be made by a synthesis process such as quartz made by hydrothermal synthesis. To form a synthetic quartz crucible, natural sand may be arc fused to form a crucible body shell and synthetic sand is arc fused onto the inner surface of the shell as a liner. The synthetic sand liner may have an impurity level relatively less than the natural sand shell (e.g., 5 to 10 times less). For example, natural sand may have impurity concentrations of at least 5 ppm aluminum, at least 0.1 ppm calcium, at least 0.1 ppm iron, at least 0.1 ppm potassium, at least 0.05 ppm lithium, at least 0.3 ppm sodium and at least 0.5 ppm titanium while synthetic sand may have a concentration of less than 0.01 ppm aluminum, less than 0.01 ppm calcium, less than 0.075 ppm iron, less than 0.01 ppm potassium, less than 0.01 ppm lithium, less than 0.01 ppm sodium, and less than 0.01 ppm titanium. The crucible body 103 (including any liner thereof) may have any thickness which allows the crucible to function as described herein.

At least a portion of the inner and outer surfaces 112, 120 of the sidewall 114 of the crucible body 103 described above may be coated with a coating composition. The coating composition may include an oxide or carbonate of magnesium, calcium, strontium or barium (e.g., hydroxide thereof such as Ba(OH)). In some embodiments, the coating composition includes a barium hydroxide or barium carbonate such as $Ba(OH)_2$ or $BaCO_3$.

The oxide may be dissolved or suspended in a solution or carrier such as deionized water. The coating composition may be applied to a first inner surface area 121 of the inner surface 112 of the body 103 and to a first outer surface area 123 of the outer surface 120 of the body 103. The hydroxide or carbonate may be dissolved or suspended in a solution or carrier such as deionized water or a mixture of water and isopropyl alcohol. The coating composition may be applied to a first inner surface area 121 of the inner surface 112 of the body 103 and to a first outer surface area 123 of the outer surface 120 of the body 103.

Figure 3:
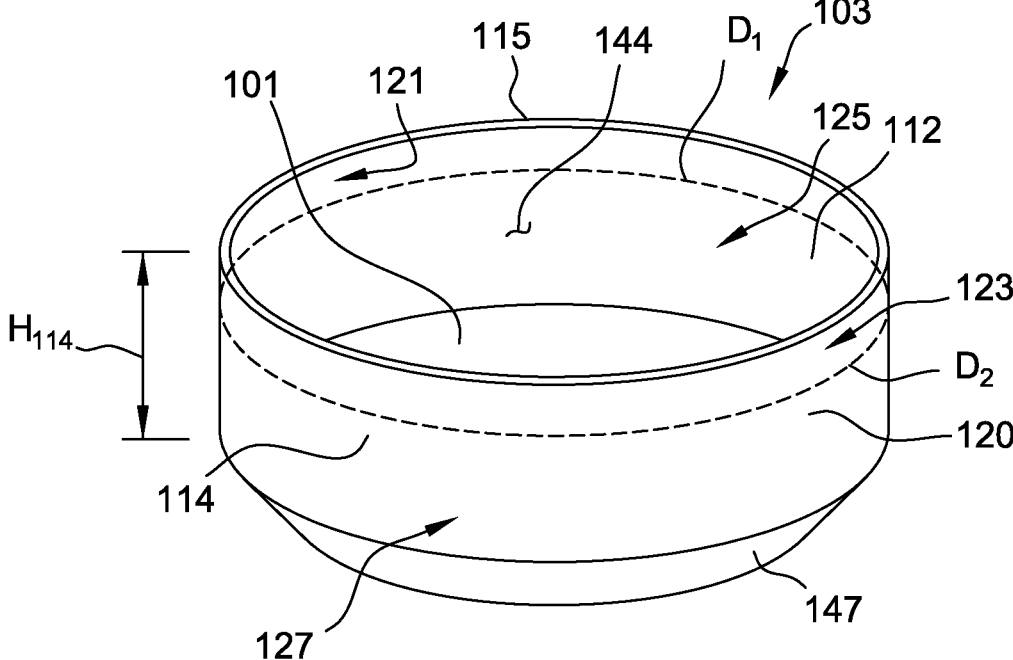
FIG. 3 is a perspective view of a crucible body of the crucible of the ingot puller apparatus of FIG. 1.
Figure 4:
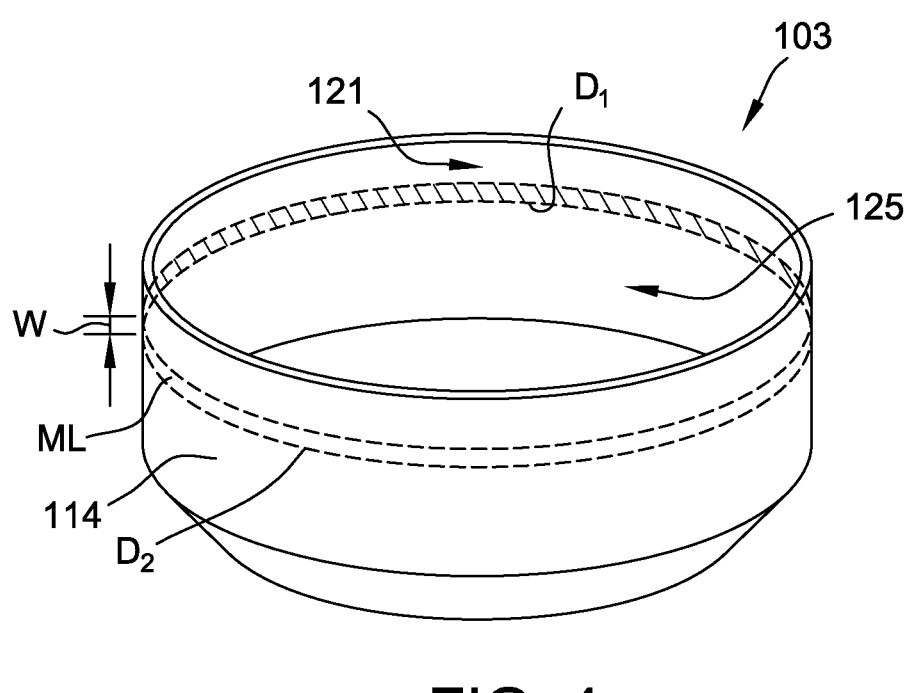
FIG. 4 is a perspective view of the crucible body with the melt line and rim coating distances $D_1$ and $D_2$ shown.

The first inner surface area 121 to which the coating is applied extends only from the top 115 of the sidewall 114 to a distance $D_1$ from the top of the sidewall. This distance $D_1$ is less than the height $H_{114}$ of the sidewall 114. The first outer surface area 123 extends only from the top 115 of the sidewall 114 to a distance $D_2$ from the top of the sidewall 114. This distance $D_2$ is less than the height $H_{114}$ of the sidewall 114. $D_1$ and $D_2$ may be the same distances as shown in FIGS. 3-5 or, as in other embodiments, different distances.

In some embodiments, $D_1$ (and optionally $D_2$) corresponds to the position of the melt line ML (FIG. 1). The melt line ML is the position of the inner surface 112 of the sidewall where the surface 111 of the melt 104 interfaces with the crucible 102 (i.e., the coating extends down to the melt line ML) during a "stabilization phase" of the ingot growth process. As shown in FIG. 4, the melt line ML has a width W (i.e., the melt line is a band that forms on the crucible inner surface) which is the width at which the crucible is eroded at the interface during the stabilization phase. This width results from different centrifugal forces applied to the melt during different crucible rotation rates during stabilization, neck growth, and crown growth. This width may be at least 1 mm, at least 5 mm or at least 10 mm (e.g., 1 mm to 20 mm or 5 mm to 15 mm). The coating may extend down to the top of the melt line ML, the bottom of the melt line ML, to a point between the top and bottom of the melt line ML or even below the melt line ML as described below (FIG. 5).

Figure 5:
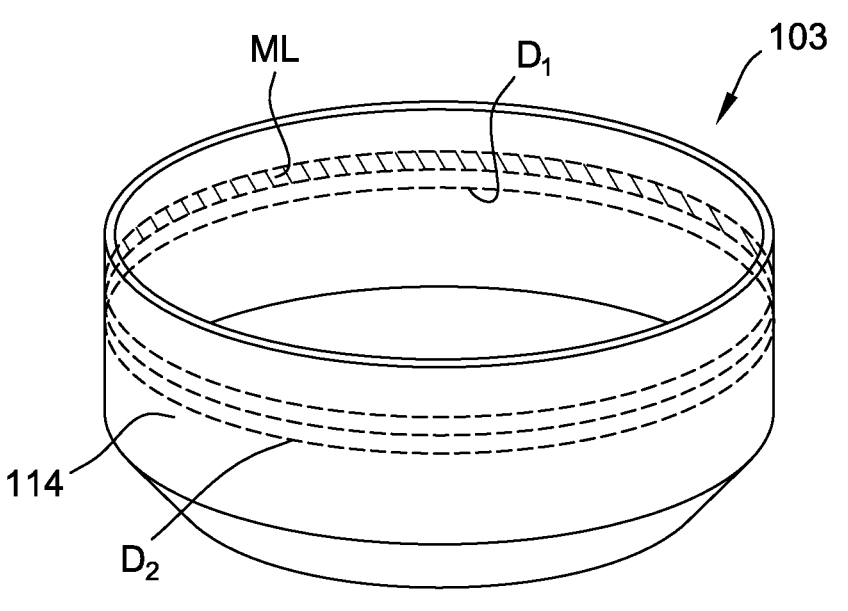
FIG. 5 is a perspective view of a crucible body of another embodiment with the melt line and rim coating distances $D_1$ and $D_2$ shown.

In some embodiments and as shown in FIG. 5, the distance $D_1$ to which the coating extends from the top 115 of the crucible (and optionally the distance $D_2$ to which the coating extends over the first outer surface area 123) is below the melt line ML. For example, the length at which the distance $D_1$ extends below the melt line (i.e., below the bottom of the melt line ML) may be at least 1 times the width of the melt line ML, or at least 5 times the width of the melt line ML, from 1 to 10 times the width of the melt line ML, or from 1 to 5 times the width of the melt line ML. This length at which the coating extends below the melt line ML may be at least 5 mm below the melt line ML, at least 10 mm, at least 25 mm, at least 50 mm, at least 100 mm, or from 5 mm to 100 mm, from 10 mm to 100 mm or 10 mm to 25 mm below the melt line.

The inner surface 112 of the crucible body 103 may include a second inner surface area 125 that extends from $D_1$ to the floor 101 of the crucible body 103. In some embodiments, the second inner surface area 125 (and optionally 101) does not have a coating disposed on the area 125 (i.e., other than a synthetic quartz liner of the crucible body 103). In other embodiments (e.g., natural sand crucible), at least a portion of the second inner surface area 125 (and optionally 101) does have a coating disposed thereon with the coating being different from the coating described above.

The coating compositions may be applied to the first inner surface area 121 and the first outer surface area 123 by dipping the crucible into the coating composition. In other embodiments, the coating is applied by chemical vapor deposition, plasma spraying, brushing, aerosol spraying, pouring or any combination of these. The coating composition may be applied in a single application or multiple times to reach a desired thickness. The final coating may have a thickness of at least about 1 μm.

Once a coating composition is applied to a first inner surface area 121 and the first outer surface area 123, the composition may be dried to vaporize the carrier (e.g., water). Generally, the crucible may be dried under any atmosphere including, for example, ambient air, nitrogen, argon or mixtures thereof. Generally when ambient air is utilized, a substantial portion if not all of the carrier vaporizes after about 20 minutes and, in other embodiments, after about 30 minutes or even after 40 minutes. By increasing ventilation (e.g., by the use of circulating air), drying times may be proportionally decreased. Generally, the coating is dried when the coating does not adhere or transfer material to human fingers upon contact with the coating.

The coating composition may be applied and dried several times to increase the thickness of the coating. Each application may be air-dried to remove the carrier before application of another coat. Alternatively or in addition, heating may be utilized. In some embodiments, the crucible is heated to at least about 150° C., to at least about 200° C., to at least about 300° C., to at least about 400° C. or even to at least about 750° C. to dry and sinter the coating composition. The crucible may be heated for at least about 1 hour and, in other embodiments, at least about 2 hours, at least about 3 hours or from about 1 hour to about 5 hours.

The crucible may be heated in the presence of an inert gas such as, for example, nitrogen, helium or argon. Ambient air may also be used as the atmosphere during heating but is less preferred as it may introduce oxygen into the coating. Further, the materials of construction of the furnace as well as the gas flows may be controlled to avoid oxidation of the coating as appreciated by those of skill in the art.

Figure 6:
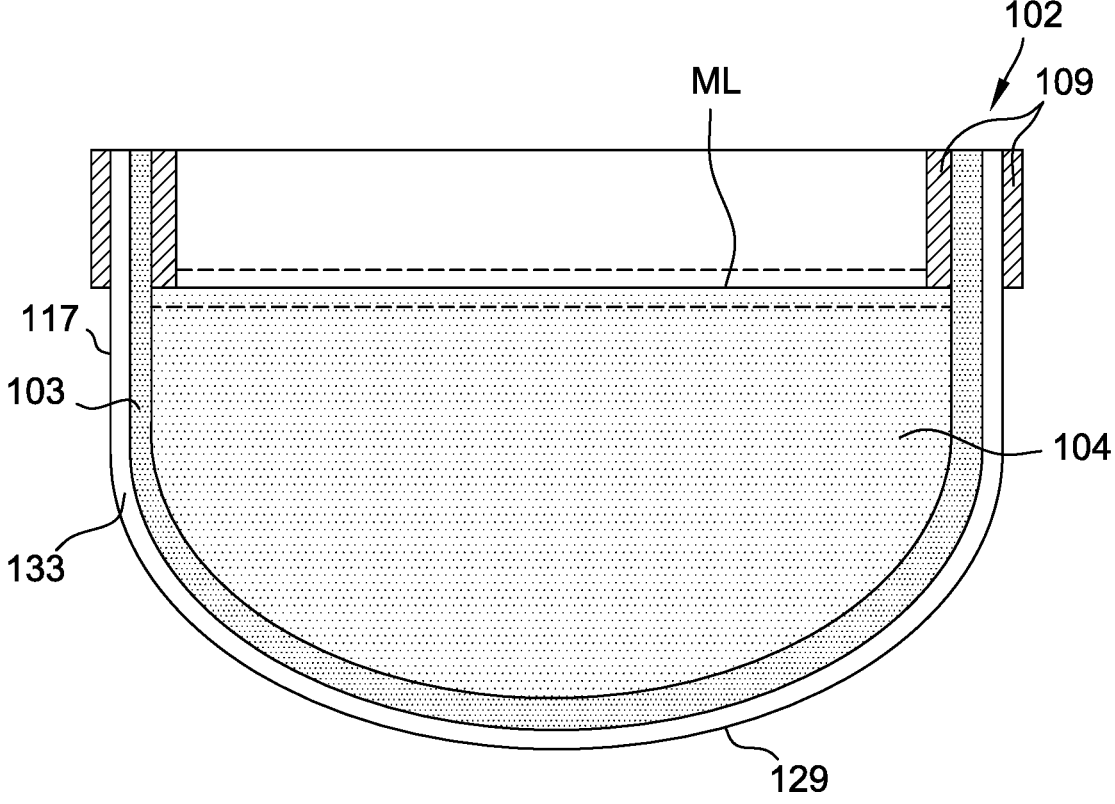
FIG. 6 is a cross-section of the crucible of the ingot puller apparatus of FIG. 1.

In some embodiments, a second coating is disposed on one or more portions of the inner and outer surfaces 112, 120 before the coating described above (which may be referred to herein as a "first" coating) is applied. For example, a second coating 133 (FIG. 6) may be disposed on at least a portion of the outer surfaces of the crucible. The second coating 133 may be disposed on a second outer surface area 127 of the outer surface 120 of the sidewall 114. The second outer surface area 127 extends from the first outer surface area 123 (FIG. 3) to the floor 101 of the crucible body 103. The second coating 133 may also be disposed on the first outer surface area 123 (i.e., between the crucible body 103 and the first coating 109). The second coating 133 is different from the first coating 109. For example, the second coating 133 may include aluminum. In some embodiments, the second coating 133 comprising aluminum is not applied above the melt line ML.

Figure 7:
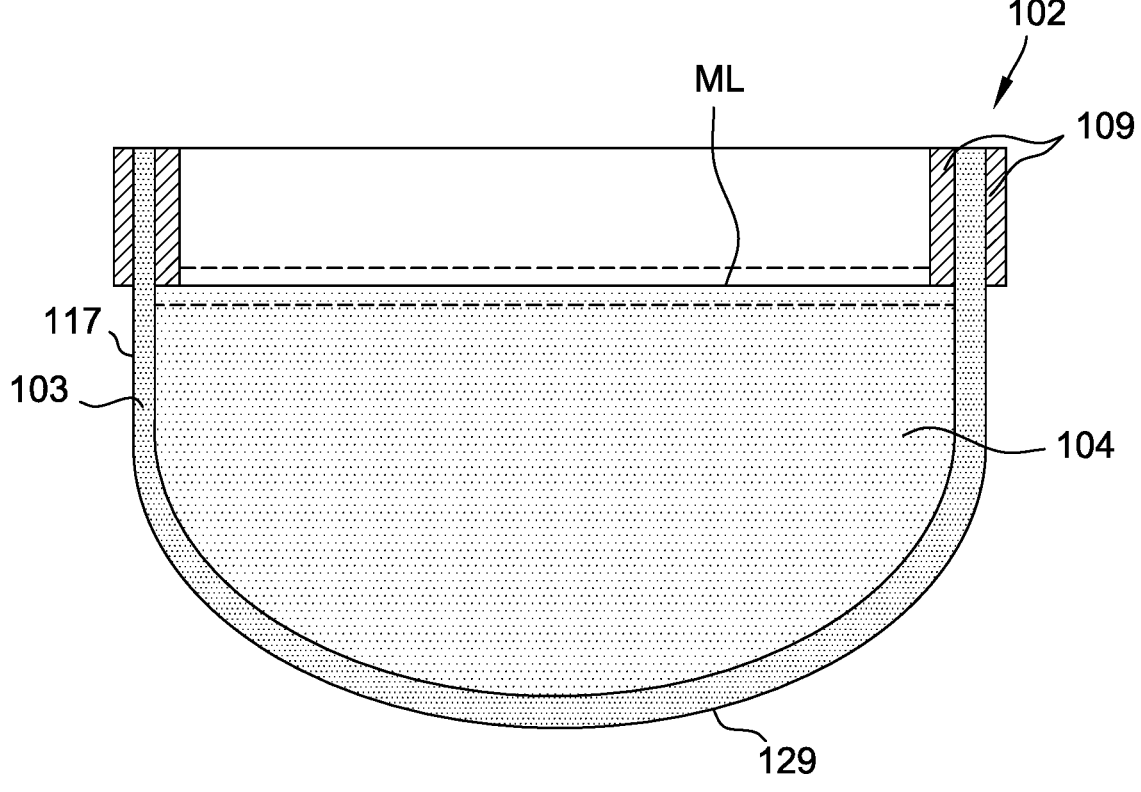
FIG. 7 is a cross-section of another embodiment of the crucible.

Referring now to FIG. 7, in other embodiments, the crucible 102 does not include a second coating on the outer surface 120 of the sidewall (or the inner surface 112 of the sidewall). The coating 109 described above is applied directly to the outer surface 120 and/or directly to the inner surface 112.

The coating crucibles 102 described above may be used to prepare a single crystal silicon ingot by the Czochralski process. The crucible may be generally used in any ingot puller apparatus that is configured to pull a single crystal silicon ingot. An example ingot puller apparatus (or more simply "ingot puller") is indicated generally at "100" in FIG. 1. The ingot puller apparatus 100 includes the crucible 102 described above for holding a melt 104 of silicon. The crucible 102 is supported by a susceptor 106. The ingot puller apparatus 100 includes a crystal puller housing 108 that defines a growth chamber 152 for pulling a silicon ingot 113 (FIG. 2) from the melt 104 along a pull axis A.

The crucible 102 has a floor 129 and a sidewall 117 that extends from the base or floor 129. The sidewall 117 is generally vertical and is cylindrical in shape. The floor 129 of the crucible 102 includes the curved portion of the crucible 102 that extends below the sidewall 114. The crucible 102 is supported by a susceptor 106. The susceptor 106 is supported by a shaft 105. The susceptor 106, crucible 102, shaft 105 and ingot 113 (FIG. 2) have a common longitudinal axis A or "pull axis" A.

A pulling mechanism 132 is provided within the ingot puller apparatus 100 for growing and pulling an ingot 113 from the melt 104. Pulling mechanism 132 includes a pulling cable 118, a seed holder or chuck 155 coupled to one end of the pulling cable 118, and a silicon seed crystal 122 coupled to the seed holder or chuck 155 for initiating crystal growth. One end of the pulling cable 118 is connected to a pulley (not shown) or a drum (not shown), or any other suitable type of lifting mechanism, for example, a shaft, and the other end is connected to the chuck 155 that holds the seed crystal 122. In operation, the seed crystal 122 is lowered to contact the melt 104. The pulling mechanism 132 is operated to cause the seed crystal 122 to rise. This causes a single crystal ingot 113 (FIG. 2) to be withdrawn from the melt 104.

Figure 2:
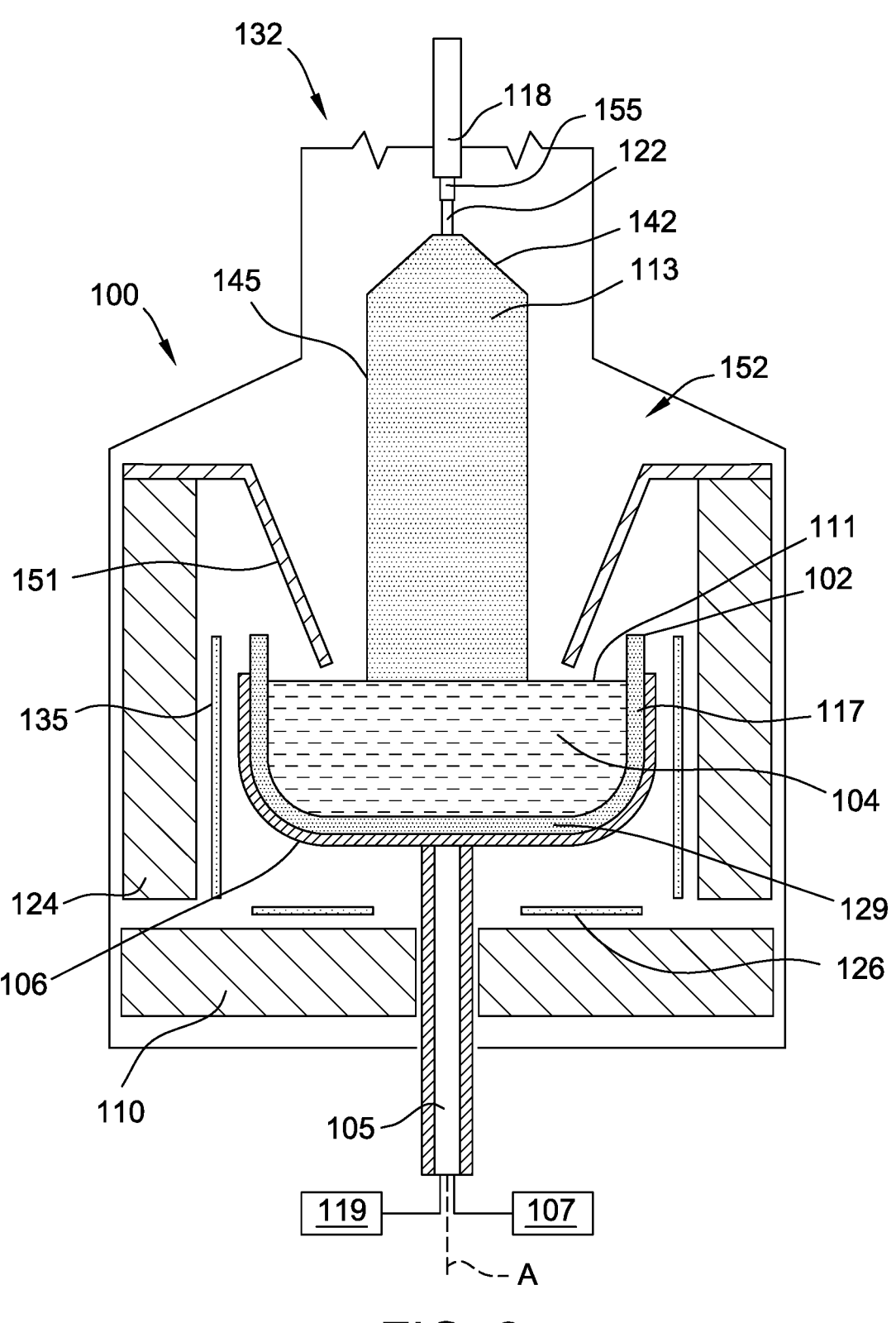
FIG. 2 is a cross-section of the ingot puller apparatus of FIG. 1 during silicon ingot growth.

During heating and crystal pulling, a crucible drive unit 107 (e.g., a motor) rotates the crucible 102 and susceptor 106. A lift mechanism 132 raises and lowers the crucible 102 along the pull axis A during the growth process. For example, as shown in FIG. 1, the crucible 102 may be at a lowest position (near the bottom heater 126) in which an initial charge of solid-phase polycrystalline silicon previously added to the crucible 102 is melted. Crystal growth commences by contacting the melt 104 with the seed crystal 122 and lifting the seed crystal 122 by the pulling mechanism 132. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102. The initial semiconductor or solar-grade material that is introduced into the crucible is melted by heat provided from one or more heating elements to form a silicon melt in the crucible. The ingot puller apparatus 100 includes bottom insulation 110 and side insulation 124 to retain heat in the puller apparatus. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

Before the ingot is grown, the melt 104 may be stabilized in a stabilization phase to cool the melt. During the stabilization phase (and subsequent neck growth and crown growth), a melt line ML forms in the crucible due to erosion at the interface between the surface 111 of the melt 104 and the crucible 102.

To form the ingot after the stabilization phase, the seed crystal 122 is contacted with the surface 111 of the melt 104. The pulling mechanism 132 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. Once the ingot 113 has been grown, the ingot is sliced into a plurality of silicon substrates (i.e., wafers).

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 114 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible 102 during crystal growth (FIG. 2).

The ingot growth process may be a batch process in which polycrystalline silicon is not added to the crucible 102 during ingot growth. In other embodiments, a continuous Czochralski process is used in which polycrystalline silicon is added to the crucible 102 during ingot growth (e.g., with the crucible having one or more fluid barriers that divide the crucible into various zones). In some embodiments, a devitrification promoter such as a source of barium is added to the charge of polycrystalline silicon or to the silicon melt to modify a property of the crucible below the melt line ML during ingot growth. The devitrification promoter modifies the area below the melt line while the coating described above adds stiffness to the crucible base above the melt line. The growth process may use magnetic Czochralski growth (e.g., HMCZ) or non-magnetic Czochralski growth. In some embodiments, no magnetic field is applied during ingot growth.

The high temperature ingot growth process may modify the coating. For example, in embodiments in which barium is used, the barium in the barium oxide coating may react with the material of the quartz crucible and barium may dissolve into the quartz crucible body 103.

Compared to conventional crucibles and ingot growth processes, the crucibles and ingot growth processes of the present disclosure have several advantages. By coating the upper portion of the crucible that is above the melt line, the stiffness of the upper portion of the crucible is enhanced which reduces deformation. Deformed crucibles may contact the heat shield which can cause loss of zero dislocation (ZD) in the crucible. By not coating in an area below the coated area, air pockets are reduced. The coating may extend below the melt line (e.g., from 1 to 10 times the width of the melt line) which reduces vibrations caused by wavy surfaces just below the melt line, which are more pronounced in synthetic quartz crucibles. The coating maintains crucible smoothness even at longer run times. The extended rim coating results in more stable neck control which helps remove dislocations in the neck. This results in improved crown and early body zero dislocation success and a higher incidence of zero dislocations in the full body. The extended coating results in less neck attempts and increase the recharge capability of the crucible. The extended coating reduces melt vibrations during neck growth which reduces neck pop-outs in both magnetic Czochralski and non-magnetic Czochralski. The coating may decrease crucible dissolution at the melt line and/or fracture of a quartz crucible particle into the melt which improves zero dislocation success.

EXAMPLES

The processes of the present disclosure are further illustrated by the following Examples. These Examples should not be viewed in a limiting sense.

Figure 8:
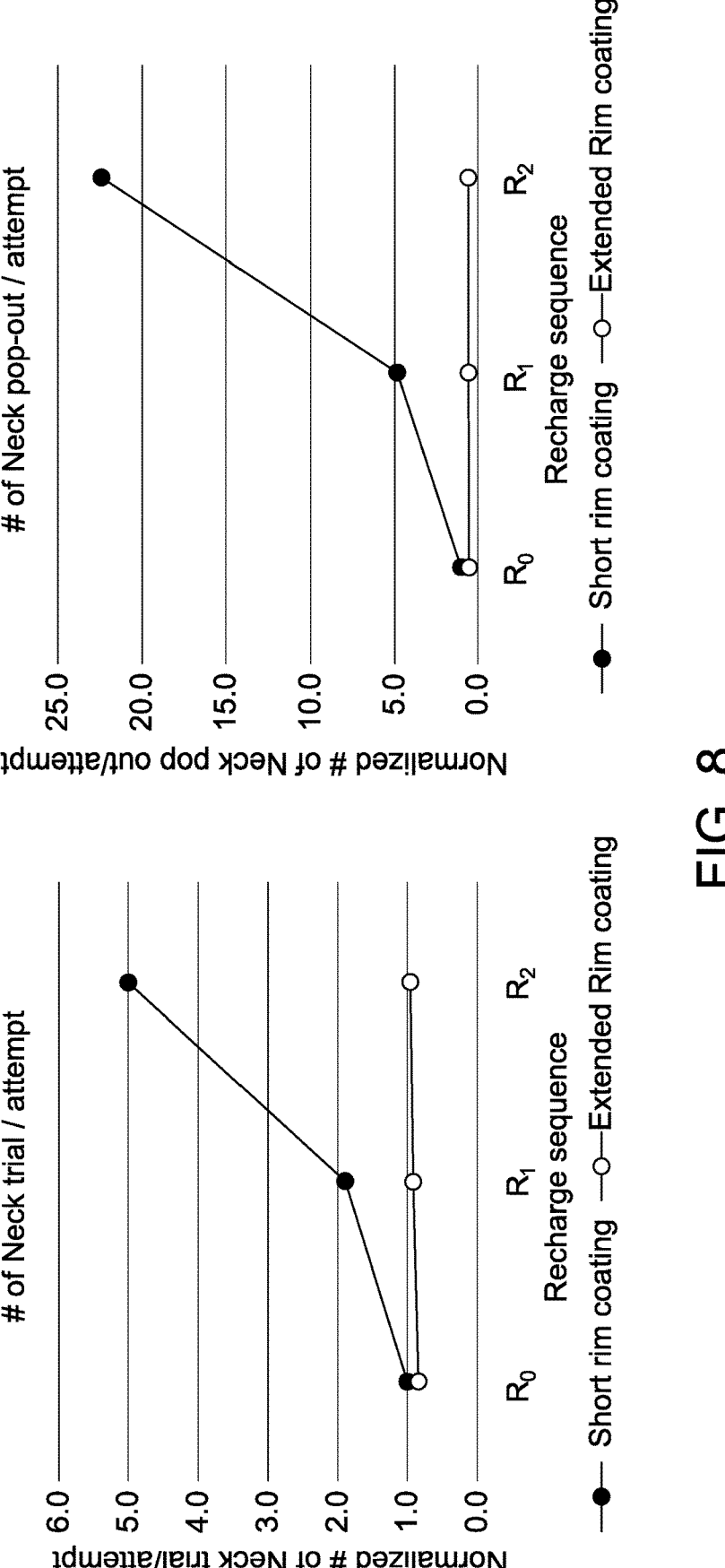
FIG. 8 includes graphs showing the number of neck trials and pop-outs for crucibles having a rim coating that did not extend to the melt line and for crucibles having a rim coating that did extend to the melt line.

Example 1: Comparison of Crucibles with a
Barium Coating that does not Extend to the Melt
Line and that Extends to the Melt Line Synthetic quartz crucibles were used to grow three single crystal silicon ingots—a parent ingot ($R_o$), an ingot grown after recharge of polycrystalline silicon ($R_1$), and an ingot grown after a second recharge of polycrystalline silicon ($R_2$). The number of neck trials (i.e., number of neck attempts) and pop-out events for loss of zero dislocation are shown for each ingot attempt. A first set of crucibles had a barium rim coating (inside and outside surfaces) that stopped about 0-5 mm above the melt line ("Short Rim Coating") while a second set included a barium rim coating that extended about 1 inch below the melt line (~3× the width of the melt line) on the inside and outside surfaces ("Extended Rim Coating"). As shown in FIG. 8, the extended rim coating reduced neck attempts and pop-out events by reducing the melt vibrations, especially in recharge ingots. Such recharge ingots are more susceptible to time dependent crucible damage which is exasperated by increasing attempts and pop-outs. If these events are reduced, the cycle time is reduced overall, leading to less overall crucible damage.

Figure 9:
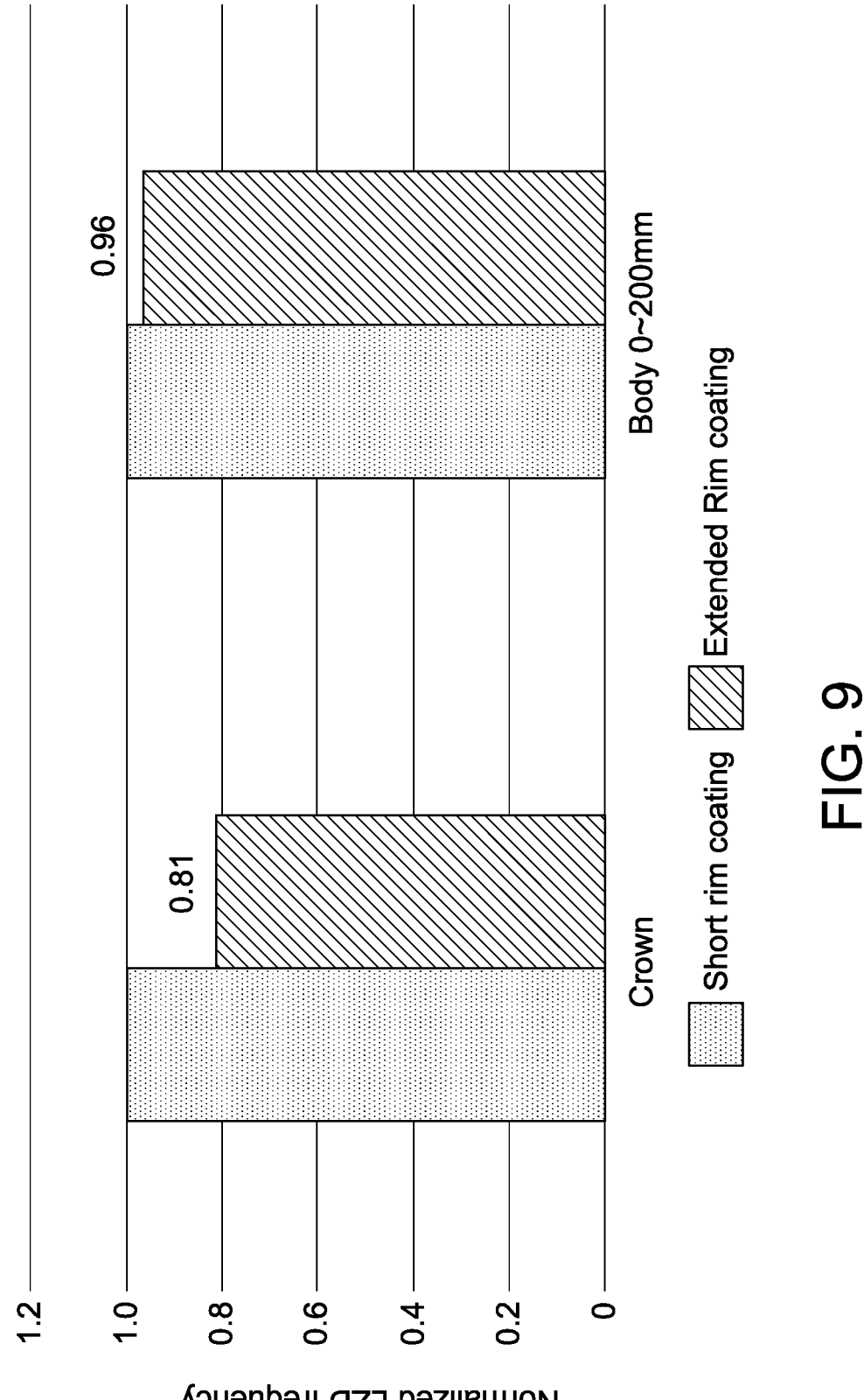
FIG. 9 includes bar graphs that show the frequency at which the zero dislocation state is lost in crown/early body for crucibles having a rim coating that did not extend to the melt line and for crucibles having a rim coating that did extend to the melt line.

FIG. 9 compares crown/early body frequency at which the zero dislocation state is lost (normalized). As shown in FIG. 9, zero dislocation was maintained more frequently with the crucibles having the extended rim coating relative to the short rim coating.

Figure 10:
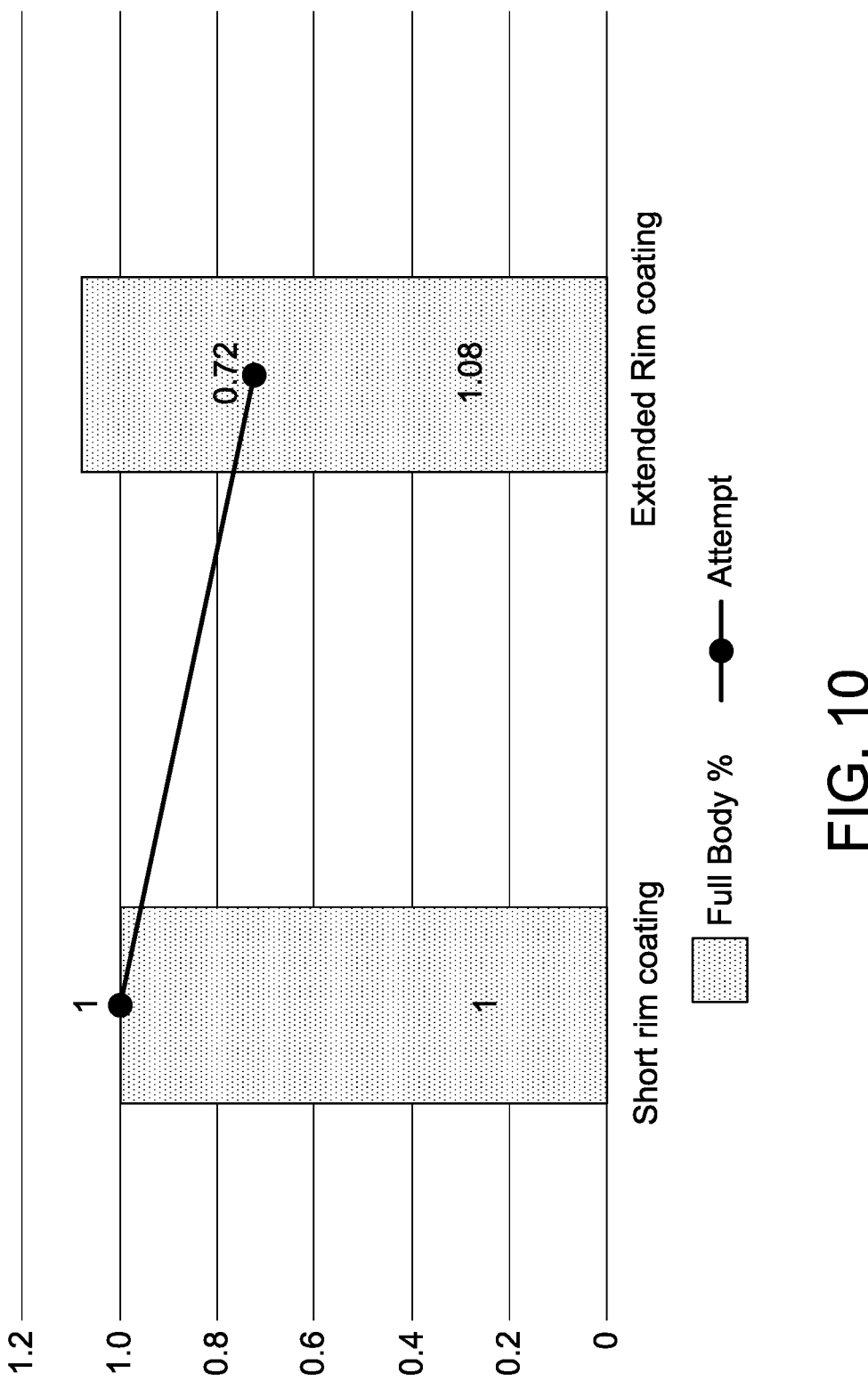
FIG. 10 includes bar graphs that show the normalized full body ratio and attempts for crucibles having a rim coating that did not extend to the melt line and for crucibles having a rim coating that did extend to the melt line.

FIG. 10 compares the full body ratio and attempts respectively for the short rim coating verses the extended rim coating. As shown in FIG. 10, less attempts were needed to form the full body for crucibles having an extended rim coating.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A crucible for holding a silicon melt, the crucible comprising:
a body having a floor and a sidewall extending up from the floor, the floor and sidewall defining a cavity for holding the silicon melt, the sidewall having a top, an inner surface and an outer surface, the sidewall having a height that extends from the floor to the top of the sidewall, the body comprising a natural quartz shell and a synthetic quartz liner disposed on an inner surface of the shell;
an inner surface coating disposed on a first inner surface area of the inner surface of the sidewall, the inner surface coating comprising magnesium, calcium, strontium or barium, the first inner surface area extending only from the top of the sidewall to a distance $D_1$ from the top of the sidewall, wherein the distance $D_1$ is less than the height of the sidewall, wherein the inner surface coating extends at least 10 mm below a melt line; and
an outer surface coating disposed on a first outer surface area of the outer surface of the sidewall, the outer surface coating comprising magnesium, calcium, strontium or barium, the first outer surface area extending only from the top of the sidewall to a distance $D_2$ from the top of the sidewall, wherein the distance $D_2$ is less than the height of the sidewall, the inner surface coating and the outer surface coating having the same composition.

2. The crucible as set forth in claim 1 wherein the outer surface coating is a first outer surface coating, a second outer surface area of the outer surface of the sidewall extending from the first outer surface area to the floor of the body, the crucible comprising a second outer surface coating, the second outer surface coating being disposed on the first outer surface area and the second outer surface area, the second outer surface coating comprising aluminum, the second outer surface coating being disposed between the crucible body and the first outer surface coating.

3. The crucible as set forth in claim 1 wherein the outer surface coating is the only coating disposed on the outer surface of the sidewall.

4. The crucible as set forth in claim 1 wherein the first inner surface area extends at least to the melt line.

5. The crucible as set forth in claim 1 wherein the inner surface coating and outer surface coating each comprises an oxide or carbonate of magnesium, calcium, strontium or barium.

6. The crucible as set forth in claim 1 wherein a second inner surface area of the inner surface of the sidewall extends from the first inner surface area to the floor of the crucible, the second inner surface area not comprising a coating.

7. The crucible as set forth in claim 1 wherein the inner surface coating and the outer surface coating each comprises barium oxide.

8. The crucible as set forth in claim 1 wherein a thickness of the inner surface coating and the outer surface coating each is at least 1 μm.

9. A method for forming a single crystal silicon ingot comprising:
adding an initial charge of polycrystalline silicon to the crucible set forth in claim 1;
heating the initial charge of polycrystalline silicon to cause the silicon melt to form in the crucible;
contacting a silicon seed crystal with the silicon melt; and
withdrawing the silicon seed crystal to grow the single crystal silicon ingot.

10. The method as set forth in claim 9 wherein the silicon melt is stabilized in a stabilization phase before contacting the silicon melt with the silicon seed crystal, the silicon melt forming the melt line in the crucible at an interface between a surface of the melt and the crucible, the first inner surface area extending to at least to the melt line.

11. The method as set forth in claim 9 wherein the silicon melt is stabilized in a stabilization phase before contacting the silicon melt with the silicon seed crystal, the silicon melt forming the melt line in the crucible at an interface between a surface of the melt and the crucible, the first inner surface area extending below the melt line.

12. The method as set forth in claim 11 wherein the melt line has a width, the extent to which the inner surface coating extends below the melt line being at least 5 times the width of the melt line.

13. The method as set forth in claim 12 wherein the inner surface coating extends at least 100 mm below the melt line.

14. The method as set forth in claim 9 wherein the inner surface coating and outer surface coating each comprises an oxide or carbonate of magnesium, calcium, strontium or barium.

15. The method as set forth in claim 9 wherein the inner surface coating and outer surface coating each comprises barium oxide.

16. The method as set forth in claim 9 comprising adding a source of barium to the initial charge of polycrystalline silicon or the silicon melt before pulling the silicon seed crystal to modify a property of the crucible during growth of the single crystal silicon ingot.

17. A crucible for holding a silicon melt, the crucible comprising:
a body having a floor and a sidewall extending up from the floor, the floor and sidewall defining a cavity for holding the silicon melt, the sidewall having a top, an inner surface and an outer surface, the sidewall having a height that extends from the floor to the top of the sidewall, the body comprising a natural quartz shell and a synthetic quartz liner disposed on an inner surface of the shell;
an inner surface coating disposed on a first inner surface area of the inner surface of the sidewall, the inner surface coating comprising magnesium, calcium, strontium or barium, the first inner surface area extending only from the top of the sidewall to a distance $D_1$ from the top of the sidewall, wherein the distance $D_1$ is less than the height of the sidewall, wherein the inner surface coating extends at least 50 mm below a melt line; and
an outer surface coating disposed on a first outer surface area of the outer surface of the sidewall, the outer surface coating comprising magnesium, calcium, strontium or barium, the first outer surface area extending only from the top of the sidewall to a distance $D_2$ from the top of the sidewall, wherein the distance $D_2$ is less than the height of the sidewall, the inner surface coating and the outer surface coating having the same composition.

18. The crucible as set forth in claim 1 wherein the inner surface coating extends at least 100 mm below the melt line.

\* \* \* \* \*